US012488969B2

(12) United States Patent
Hyndman et al.

(10) Patent No.: US 12,488,969 B2
(45) Date of Patent: Dec. 2, 2025

(54) DEPOSITION APPARATUS

(71) Applicant: SPTS Technologies Limited, Gwent (GB)

(72) Inventors: Rhonda Hyndman, Newport (GB); Steve Burgess, Ebbw Vale (GB)

(73) Assignee: SPTS Technologies Limited, Newport (GB)

(*) Notice: Subject to any disclaimer, the term of this patent is extended or adjusted under 35 U.S.C. 154(b) by 0 days.

(21) Appl. No.: 16/918,202

(22) Filed: Jul. 1, 2020

(65) Prior Publication Data

US 2021/0005439 A1 Jan. 7, 2021

(30) Foreign Application Priority Data

Jul. 2, 2019 (GB) ..................................... 1909538

(51) Int. Cl.
*H01J 37/34* (2006.01)
*C23C 14/35* (2006.01)
(Continued)

(52) U.S. Cl.
CPC .......... *H01J 37/3438* (2013.01); *C23C 14/35* (2013.01); *C23C 14/50* (2013.01); *H01J 37/3405* (2013.01); *B81C 99/0025* (2013.01)

(58) Field of Classification Search
CPC ............... H01J 37/3438; H01J 37/3405; H01J 37/32422; H01J 37/3447; H01J 37/3244;
(Continued)

(56) References Cited

U.S. PATENT DOCUMENTS

| | | | | |
|---|---|---|---|---|
| 4,988,424 | A | 1/1991 | Woodward et al. | |
| 5,415,753 | A * | 5/1995 | Hurwitt ................ | H01J 37/347 204/192.12 |

(Continued)

FOREIGN PATENT DOCUMENTS

| | | | |
|---|---|---|---|
| CN | 1436361 | A | 8/2003 |
| CN | 1950538 | A | 4/2007 |

(Continued)

OTHER PUBLICATIONS

S. K. Dew, Theoretical and practical aspects of collimated sputtering, 1994, Journal of Applied Physics 76, p. 4857-4862 (Year: 1994).*

(Continued)

*Primary Examiner* — Patrick S Ott
(74) *Attorney, Agent, or Firm* — Hodgson Russ LLP

(57) ABSTRACT

A magnetron sputtering apparatus for depositing material onto a substrate, comprises: a chamber comprising a substrate support and a target; a plasma production device configured to produce a plasma within the chamber suitable for sputtering material from the target onto the substrate; and a thermally conductive grid comprising a plurality of cells. Each cell comprises an aperture and the ratio of the height of the cells to the width of the apertures is less than 1.0. The grid is disposed between the substrate support and the target and is substantially parallel to the target. The upper surface of the substrate support is positioned at a distance of 75 mm or less from the lower surface of the target.

12 Claims, 6 Drawing Sheets

(51) Int. Cl.
*C23C 14/50* (2006.01)
*B81C 99/00* (2010.01)

(58) Field of Classification Search
CPC ........... H01J 37/32522; H01J 2237/332; H01J 37/3408; H01J 37/3411; C23C 14/35; C23C 14/50; C23C 14/0068; C23C 14/044; C23C 14/345; C23C 14/54; C23C 14/165; C23C 14/14; B81C 99/0025
See application file for complete search history.

(56) References Cited

U.S. PATENT DOCUMENTS

| | | | | | |
|---|---|---|---|---|---|
| 5,643,428 | A * | 7/1997 | Krivokapic | H01J 37/34 | 204/192.12 |
| 5,705,042 | A * | 1/1998 | Leiphart | H01J 37/3447 | 204/192.12 |
| 6,132,575 | A * | 10/2000 | Feldman | H01J 37/3266 | 204/298.22 |
| 6,200,431 | B1 * | 3/2001 | Sone | H01J 37/3244 | 204/192.12 |
| 6,362,097 | B1 * | 3/2002 | Demaray | C23C 14/34 | 438/674 |
| 6,521,106 | B1 * | 2/2003 | Actor | H01J 37/3455 | 204/192.12 |
| 2003/0127322 | A1 * | 7/2003 | Shimakawa | H01J 37/3408 | 204/298.12 |
| 2007/0218623 | A1 * | 9/2007 | Chua | H01L 21/0234 | 257/E21.279 |
| 2009/0246385 | A1 | 10/2009 | Felmetsger et al. | | |
| 2010/0206713 | A1 * | 8/2010 | Li | H01J 37/3447 | 204/192.12 |
| 2013/0087447 | A1 | 4/2013 | Bodke et al. | | |
| 2014/0087092 | A1 | 3/2014 | Nieh et al. | | |
| 2015/0357171 | A1 * | 12/2015 | Tang | H01L 21/02104 | 204/192.12 |
| 2017/0294294 | A1 * | 10/2017 | Haymore | C23C 14/541 | |

FOREIGN PATENT DOCUMENTS

| | | | |
|---|---|---|---|
| CN | 106011761 | A | 10/2016 |
| EP | 0860514 | A2 | 8/1998 |
| EP | 2489758 | A1 | 8/2012 |
| JP | H07286271 | A | 10/1995 |
| JP | H10121234 | A | 5/1998 |
| JP | H10298753 | A | 11/1998 |
| JP | H11195620 | A | 7/1999 |
| JP | 2002520877 | A | 7/2002 |
| JP | 2010255048 | A | 11/2010 |
| JP | 2012167370 | A | 9/2012 |
| TW | 200611413 | A | 4/2006 |
| WO | 9503436 | A1 | 2/1995 |
| WO | 0004575 | A2 | 1/2000 |

OTHER PUBLICATIONS

Dew, “Theoretical and practical aspects of collimated sputtering”, Journal of Applied Physics, Oct. 15, 1994, vol. 76, No. 8, pp. 4857-4862.
Xie, et al., “Effect of process pressure on PVD AlN thin film”, IEEE 16th Electronics Packaging Technology Conference, Dec. 3, 2014, pp. 849-850, Singapore.
EPO, Extended European Search Report for EP 20166425.7, Nov. 10, 2020.
UK IPO, Search Report for GB1909538.9, Dec. 30, 2019.
CNIPA, Office Action for CN Application No. 202010391351.5, Jun. 20, 2023 (see X/Y/A designations at pp. 6-7).
TIPO, Office Action issued for TW Application No. 109119143, Feb. 21, 2021. See X/Y/A references at p. 15.
JPO, First Office Action issued in JP Application No. 2020-101398, May 28, 2024.
JPO, Second Office Action issued in JP Application No. 2020-101398, Nov. 5, 2024.
KIPO, Office Action issued in KR Patent Application No. 10-2020-0070952, Jun. 24, 2025.

* cited by examiner

DEPOSITION APPARATUS

CROSS-REFERENCE TO RELATED APPLICATIONS

This application claims priority to the patent application filed Jul. 2, 2019 and assigned UK Patent Application No. 1909538.9, the disclosure of which is hereby incorporated by reference.

FIELD OF THE DISCLOSURE

This invention relates to an apparatus for the deposition of material on semiconductor substrates and to associated methods for the deposition of material on semiconductor substrates.

BACKGROUND OF THE DISCLOSURE

Recent developments in technology areas such as driverless cars and the internet of things have led to an explosion of new opportunities for MEMS (Micro Electro Mechanical Systems) and MOEMS (Micro Opto Electrical Mechanical Systems) sensors and actuators. This increasing demand for MEMS devices is putting manufacturers under pressure to reduce production costs and increase yield and reliability. However, the build-up of film stresses during the manufacturing process of some MEMS devices can lead to problems which in turn impacts yield.

MEMS devices are typically comprised of a free standing structure or a membrane suspended over an air gap and fixed to the substrate at one or more anchor points. The manufacturing process usually starts with the deposition and patterning of a thin film that acts as a temporary support (the sacrificial layer) in the build-up of the final device. Further device layers are deposited on top of the sacrificial layer, and the sacrificial layer is finally removed to leave a free standing structure that can move freely and respond to in a predictable manner to a stimulus.

An inherent problem of freestanding structures is out-of-plane deformation induced by residual stress of the deposited films. In the worst cases, membranes can warp, buckle and even crack, and freestanding structures, such as cantilevers, can curl out of plane completely. These stress variations also negatively impact on the device performance by altering the mechanical response. For example, the mechanical response can be altered by changes in dimensions, such as the size of air gap in a capacitive sensor or reflected angle on a micro mirror, or can be altered by local changes in film stiffness.

This is a particular problem with RF (radio frequency) devices, as the resonant properties of a deformed surface is hard to predict. Stress induced variations in film stiffness leads to frequency shifts and spurious resonance, which seriously impacts on wafer device yield. In order to manufacture sensors with reproducible responses, it is important that the variation in within wafer stress is reduced to less than 180 MPa.

The present invention, in at least some of its embodiments, addresses the above described problems.

BRIEF SUMMARY OF THE DISCLOSURE

In a first aspect of the invention, there is provided a magnetron sputtering apparatus for depositing material onto a substrate, comprising:

a chamber comprising a substrate support and a target;

a plasma production device configured to produce a plasma within the chamber suitable for sputtering material from the target onto the substrate; and a thermally conductive grid comprising a plurality of cells, in which each cell comprises an aperture, and wherein the ratio of the height of the cells to the width of the apertures is less than 1.0, and wherein the grid is disposed between the substrate support and the target and substantially parallel to the target, and the upper surface of the substrate support is positioned at a distance of 75 mm or less from the lower surface of the target.

The thermally conductive grid comprises a plurality of substantially uniformly distributed cells each having an aperture. The cells are packed together in such a way so as to minimise the area between the cells. The thickness (t) (see FIG. 3) of the walls between the cells is the shortest distance between the edge of one aperture and the nearest edge of the nearest aperture. The thickness (t) of the walls between the cells may be 1 mm or more, 1.5 mm or more, 2 mm or more, 3 mm or less, 2.5 mm or less, or any combination of these values. Preferably, the thickness of the walls between the cells is in the range 1 to 3 mm, preferably 1.5 to 2.5 mm, and more preferably 2 to 2.5 mm. The thickness (t) is large enough so that the grid does not deform under the heat generated during the deposition process, but not so large that a shadowing effect or micromasking is seen in the resulting deposited film, which may adversely affect the uniformity of the deposited film.

The shape of the grid aperture may be substantially hexagonal, circular or square. Other shapes may be possible. Preferably, the shape of each aperture is substantially hexagonal, as the cells can be tightly packed together and the difference between the distance between opposing sides and opposing corners is small. This results a minimal shadowing effect or micromasking in the resulting deposited film, which in turn leads to better uniformity of the deposited film. Circular cross section cells have more unusable area between the walls of adjacent cells, and square cross section cells have a substantial difference in the distance between opposing sides and opposing corners.

The aspect ratio (AR) of the grid is defined as the ratio of the height of the cell (h) to the width (w) of the aperture (see FIGS. 2 and 3). The width (w) of the aperture is defined as the minimum distance between diametrically opposing sides of the cell and does not include the wall area between the cells. For an aperture with a substantially hexagonal shape, the aperture width is defined as the flat-to-flat edge diameter of the cell aperture, as shown in FIG. 3.

The aspect ratio (i.e. h/w) of the grid may be 1.0 or less, 0.8 or less, 0.6 or less, 0.5 or less, 0.4 or less, 0.1 or more, 0.2 or more, 0.3 or more, 0.35 or more, or any combination of these ratio values. In particular, the aspect ratio may be in the range 0.1 to 0.8, preferably 0.2 to 1.0, and preferably 0.2 to 0.6. More preferably, the aspect ratio may be in the range 0.3 to 0.5, and preferably 0.35 to 0.4. Most preferably, the aspect ratio is about 0.375. Without wishing to be bound by theory, it is believed that the low aspect ratio grid (i.e. with an aspect ratio of 1.0 or less) of the present invention provides some physical collimation of the sputtered material and reduces the number of high energy species reaching the wafer. By judicious choice of the aspect ratio of the grid, the within wafer stress range of the deposited film can surprisingly be significantly reduced.

The height (h) of each cell is 2 mm or more, 4 mm or more, 5 mm or more, 6 mm or less, 8 mm or less, 10 mm or less, or any combination of these values. In particular, the height (h) of each cell is in the range from 2 to 10 mm, preferably from 4 to 8 mm, and more preferably from 5 to 6 mm. Most preferably, the height of each cell is about 6 mm. Without wishing to be bound by theory, it is believed the low height of the grid cells (i.e. 10 mm or less) provides some physical collimation of the sputtered material, without imparting a high degree of directionality to the incoming species at the wafer surface. By judicious choice of the height of the grid cells and in turn the aspect ratio of the grid, the within wafer stress range of the deposited film can surprisingly be significantly reduced.

The width (w) of each aperture may be chosen depending upon the height of the cell in order to provide the preferred grid aspect ratio. Typically, the width (w) is in the range from 10 to 25 mm. For example, in an embodiment of the invention, the length of the flat edge of the hexagonal cell is 9 mm, which results in an aperture width (w) of about 15.6 mm, and the height (h) of the cells is about 5.8 mm, to provide an aspect ratio (h/w) of about 0.375:1.

The number of cells per 10,000 $mm^2$ of grid may be 70 or less, 50 or less, 20 or more, 40 or more, or any combination of these values. Preferably, the number of cells per 10,000 $mm^2$ of grid is in the range from 40 to 50.

The grid is disposed between the substrate support and the target and substantially parallel to the target. The grid may be mounted within the chamber by any suitable means. In some embodiments, the grid may be mounted on the wall of the chamber.

The grid comprises a thermally conductive material. The grid will heat up as a result of the sputtering process and in order to prevent the grid from deforming this heat must be removed. For example, if the grid is mounted on the wall of the chamber, heat may be conducted away from the grid to the chamber wall. The grid may be composed of metal, in particular titanium, stainless steel, copper, aluminium, or any combination of these metals.

In some embodiments, the upper surface of the substrate support is positioned at a distance of 75 mm or less, 60 mm or less, 55 mm or less, 40 mm or more, 45 mm or more, or any combination of these values, from the lower surface of the target. In particular, the upper surface of the substrate support is positioned at a distance in the range from 40 to 75 mm, and more preferably 45 to 55 mm from the lower surface of the target. Most preferably, the upper surface of the substrate support is positioned at a distance of about 50 mm from the lower surface of the target. By using such distances between the upper surface of the substrate support and the lower surface of the target relating to a conventional short throw apparatus, more of the target material reaches the wafer resulting in better target utilisation and there is a higher deposition rate. Therefore, there is advantageously an overall lower economic cost in fabricating the deposited film.

An apparatus in which the upper surface of the substrate support is positioned at a distance in the range from about 40 to about 75 mm from the lower surface of the target is described as a conventional short throw apparatus. An apparatus in which the upper surface of the substrate support is positioned at a distance from about 150 to about 300 mm from the lower surface of the target is described as a conventional long throw apparatus.

In some embodiments, the upper surface of the grid is positioned at a distance of 10 mm or more from the lower surface of the target. In some embodiments, the upper surface of the grid is positioned at a distance of 20 mm or less from the lower surface of the target. Preferably, the upper surface of the grid is positioned at a distance of about 18 mm from the lower surface of the target. Preferably, the grid is disposed about half way between the lower surface of the target and the upper surface of the substrate support. This spacing of the grid achieves a good balance between collimation and masking of the wafer.

The length and width of the grid can be larger than or similar to that of the target. Typically, the length and width of the grid is similar to that of the target. It will be appreciated that typically the substrate to be processed, the target and the interior of the chamber are of circular cross-section. In this case, the grid may have a corresponding circular cross-section with a diameter which is similar to that of the target.

The grid may also be electrically conductive. In particular, the grid may be electrically conductive and grounded. Without wishing to be bound by theory, it is believed that if the grid is floating rather than grounded, positive ions would charge up the grid and repel at least some of the incoming ions. By using a grounded grid a larger proportion of charge ions will interact with the grid, which results in more effective filtering of high energy species and thermalizing of the plasma. This advantageously leads to a further reduction in the within wafer stress range of the deposited film.

The chamber has an associated plasma generation device. Any suitable gas may be used to sustain the plasma. Preferably, an inert gas such as Ar, Ne or Kr may be used to sustain the plasma. However, in reactive applications $N_2$, $H_2$ or $O_2$ could also be used, if required.

Typically, the substrate support is configured to support a substrate having a diameter of at least 200 mm. Excellent results have been achieved with the present invention when applied to wafers having diameters of 200 mm and 300 mm.

Any suitable material may be deposited on the substrate, such as metal, dielectrics or semiconducting materials. Particularly good results have been achieved by using a metal as the deposited material, such as Mo, W, Ta, Ti, Pt, Cr, Ru or Al.

Preferably, the substrate support is RF biased.

The apparatus of the invention may be provided in combination with the substrate, the substrate being supported by the substrate support. However, the invention pertains also the apparatus when not in use or prior to use, i.e., without the substrate present on the substrate support.

In a second aspect of the invention, there is provided a method for depositing material onto a substrate by magnetron sputtering comprising:

providing an apparatus according to claim 1;
supporting the substrate on the substrate support;
providing a plasma so that material is sputtered from the target onto the substrate; and
wherein the sputtered material passes through the apertures of the grid before reaching the substrate.

In a third aspect of the invention, there is provided a substrate comprising a layer of material thereon, in which the material is deposited by a method according to the second aspect of the invention and the deposited layer of material has a within wafer stress value of less than 180 MPa.

The substrate may form part of a device or a precursor of a device which comprises at least one semiconductor component. The substrate may comprise a semiconductor wafer, such as a silicon wafer. The film may be deposited directly onto the semiconductor wafer. Alternatively, the layer may be deposited onto an additional element of the substrate, such as a dielectric, semiconductor or metallic layer.

In a fourth aspect of the invention, there is provided a device comprising a substrate according to the third aspect of the invention.

In a fifth aspect of the invention, there is provided a use of the apparatus according to the first aspect of the invention for depositing a material layer on a substrate, in which the deposited material has a within wafer stress value of less than 180 MPa.

In a sixth aspect of the invention, there is provided a kit for retrofitting an existing magnetron sputtering apparatus in order to provide a retrofitted magnetron sputtering apparatus according to the first aspect of the invention, the kit comprising a connection means permitting the grid to be connected to one or more portions of the existing magnetron sputtering apparatus to locate the grid in place between the target and the substrate support. For example, the connection means may connect the grid to the chamber wall.

The apparatus of the invention may be provided as an original item of manufacture. Alternatively, an advantage of the present invention is that it is possible to retrofit existing magnetron sputtering apparatus with the grid of the present invention. Also, instead of retrofitting an existing apparatus, it is possible to produce a new magnetron sputtering apparatus in accordance with the invention.

Whilst the invention has been described above, it extends to any inventive combination of the features set out above, or in the following description, drawings or claims. For example, any feature described in relation to the first aspect of the invention is considered to be disclosed also in relation to the second aspect of the invention and vice versa. For the avoidance of doubt, whenever reference is made herein to 'comprising' or 'including' and like terms, the invention is also understood to include more limiting terms such as 'consisting' and 'consisting essentially'.

DESCRIPTION OF THE DRAWINGS

Embodiments of metal deposition apparatus in accordance with the invention will now be described with reference to the accompanying drawings, in which.

DETAILED DESCRIPTION OF THE DISCLOSURE

Figure 1:
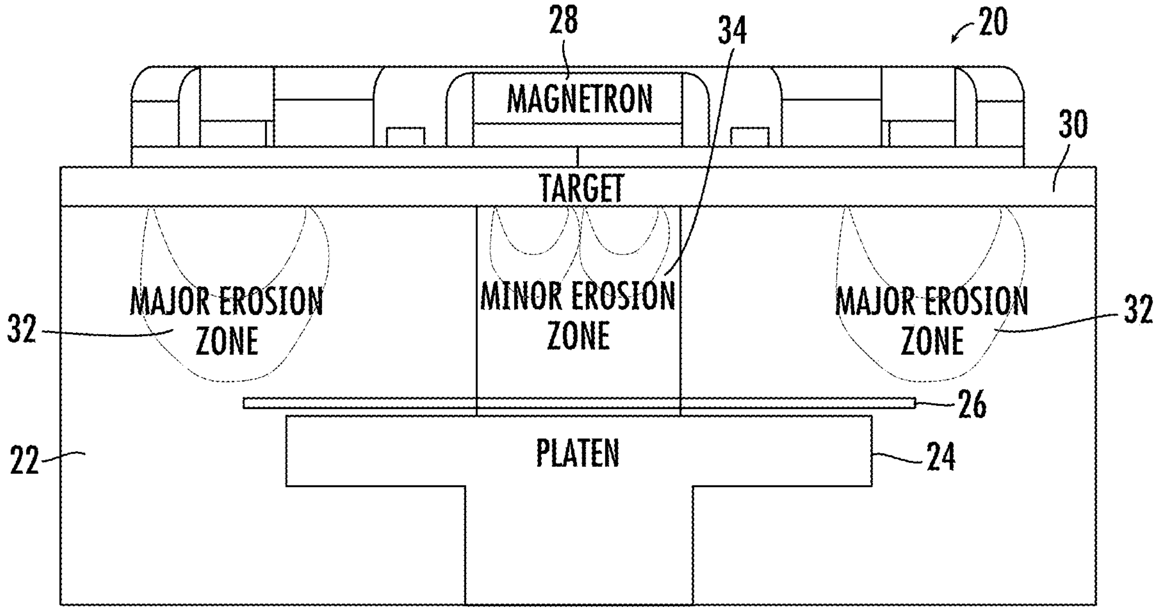
FIG. 1 is a schematic view of a DC magnetron sputtering system showing major and minor erosion zones.

FIG. 1 shows a typical DC magnetron rotating sputtering system, depicted generally at 20. The apparatus 20 comprises a chamber 22, in which the interior of the chamber 22 houses a platen (or substrate support) 24 on which a workpiece 26 such as a semiconductor wafer may be loaded. The apparatus further comprises a magnetron 28 and a target 30.

Stress in thin films arising as a result of the deposition method has two main components—thermal stress and intrinsic stress. For materials with a high melting point, such as metals including Mo, Ti and W, the variation in thermal stress across a wafer can generally be ignored as the wafer temperature is too low to induce any variation in thermally activate growth processes in the film structure. However, sputter deposition is an energetic process and can generate variable stresses in thin films due to ballistically activated changes in the film structure.

Sputtering thin films involves ejecting material from a target 30 onto a substrate 26, such as a silicon wafer. Intrinsic stresses are generated in the thin layers during the deposition process, and these intrinsic stresses are closely related to the energy and flux of particles generated in the plasma arriving at the wafer. These intrinsic stresses are largely controlled by the geometry of the magnetron pole piece. Simple and reliable models have been established to estimate the relationship between the magnetic fields and the deposited film thickness. However, the same cannot be said for the relationship between thin film stress and the magnetron design. It is believed that this is because intrinsic stresses in thin films are closely related to the microstructure evolution and growth process for any particular film. Any theory relating to thin film stress must also take into account a multitude of processes occurring at the atomic scale, for example interfacial effects between the substrate and metal, crystal orientation, grain-boundary formation and growth, defect formation and mobility. As a result, a conventional magnetron apparatus can be designed to deliver a highly uniform film in terms of thickness and resistivity, but designing a magnetron apparatus to optimise stress uniformity is very difficult.

The plasma profile for a rotating magnetron sputter system optimised for thickness is not uniform across the target. In fact, the plasma is concentrated near the cathode and beneath the region of highest magnetic field, which is swept over the sputter target. FIG. 1 depicts this problem in a typical rotating magnetron system. The apparatus 20 shows the major erosion zones 32 and the minor erosion zone 34 of the target 30 (i.e. the cathode) as dictated by the outer magnets. The wafer 26 sits inside the main erosion zone 32. Beneath the magnet is a high density plasma, such as Ar and metal ions. A proportion of these ions escape the negative glow of the plasma and move towards the wafer platen, causing the generation of compressive stress preferentially at the edge of the wafer.

Figure 2:
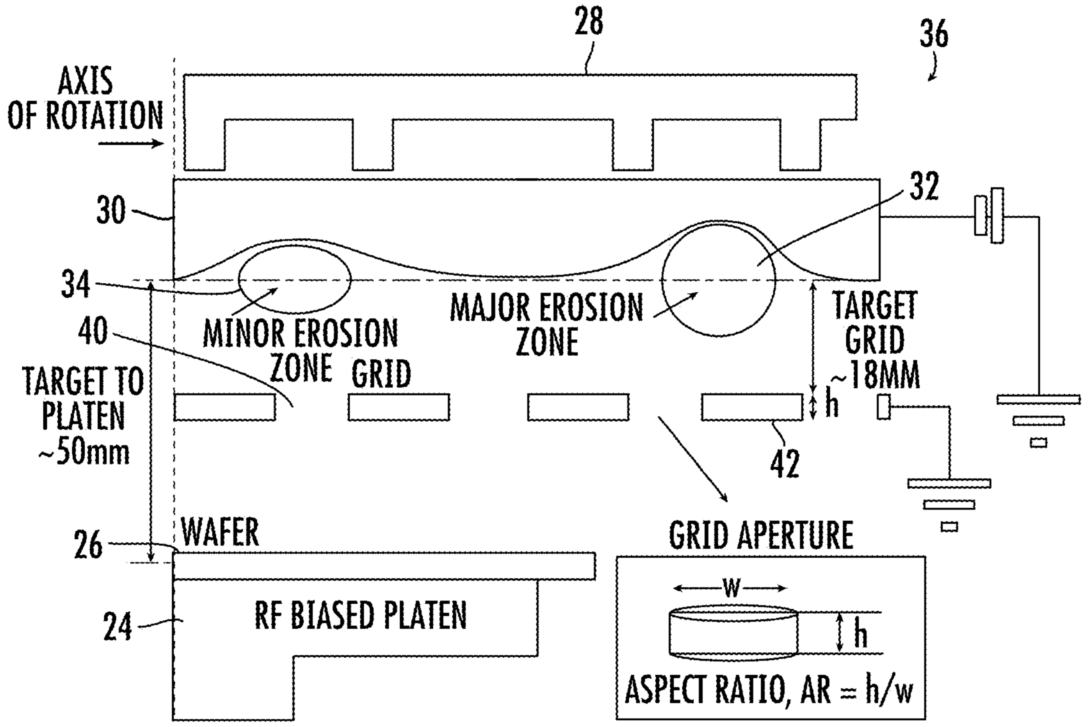
FIG. 2 is a schematic view of a DC magnetron sputtering system including a grid of the present invention.

FIG. 2 shows a first embodiment of a deposition apparatus of the invention, depicted generally at 36. The embodiment shown in FIG. 2 is in fact a commercially available magnetron sputtering apparatus which has been retrofitted to produce apparatus in accordance with the present invention. The apparatus 36 is a conventional deposition chamber fitted with a grid 38 of the invention. The grid comprises a plurality of cells 44, in which each cell has an aperture 40 and the area between the cells is shown by 42. In this embodiment of the invention, the grid 38 is grounded and positioned approximately half way between the target 30 and the substrate support 24. Without wishing to be bound by theory, it is believed that the grounded grid filters out high energy species generated at the major erosion zone 32 and thermalizes the plasma. The insert in FIG. 2 shows the width (w) and height (h) of the cell aperture. The dotted line shows the axis of rotation of the magnetron 28. In this embodiment of the invention, the upper surface of the substrate support 24 is positioned at a distance of about 50 mm from the lower surface of the target 30, and the upper surface of the grid 38 is positioned at a distance of about 18 mm from the lower surface of the target 30. Therefore, the grid 38 sits approximately half way between the target 30 and the substrate support 24.

It has been found that the within wafer stress of thin films, such as for example thin metal films of Mo, W, Ta, Ti, Pt, Cr, Ru and Al, which have been deposited by magnetron sputtering, can be decreased dramatically by the addition of a grid 38 placed between the target 30 and the wafer 26. Without wishing to be bound by theory, it is believed that the grid 38 modifies the deposition flux and the energy of the impinging species by selectively reducing the portion of the high energy species generated in the outer erosion profile reaching the wafer and by thermalizing the contribution from the rest of the plasma. In this way the within wafer stress uniformity can be advantageously reduced to less than about 180 MPa. This in turn leads to higher mechanical reliability of the films and higher performance of the device incorporating the film. In fact, it has been found that low within wafer stress uniformity can advantageously be maintained largely independently of material and deposition parameters.

Figure 3:
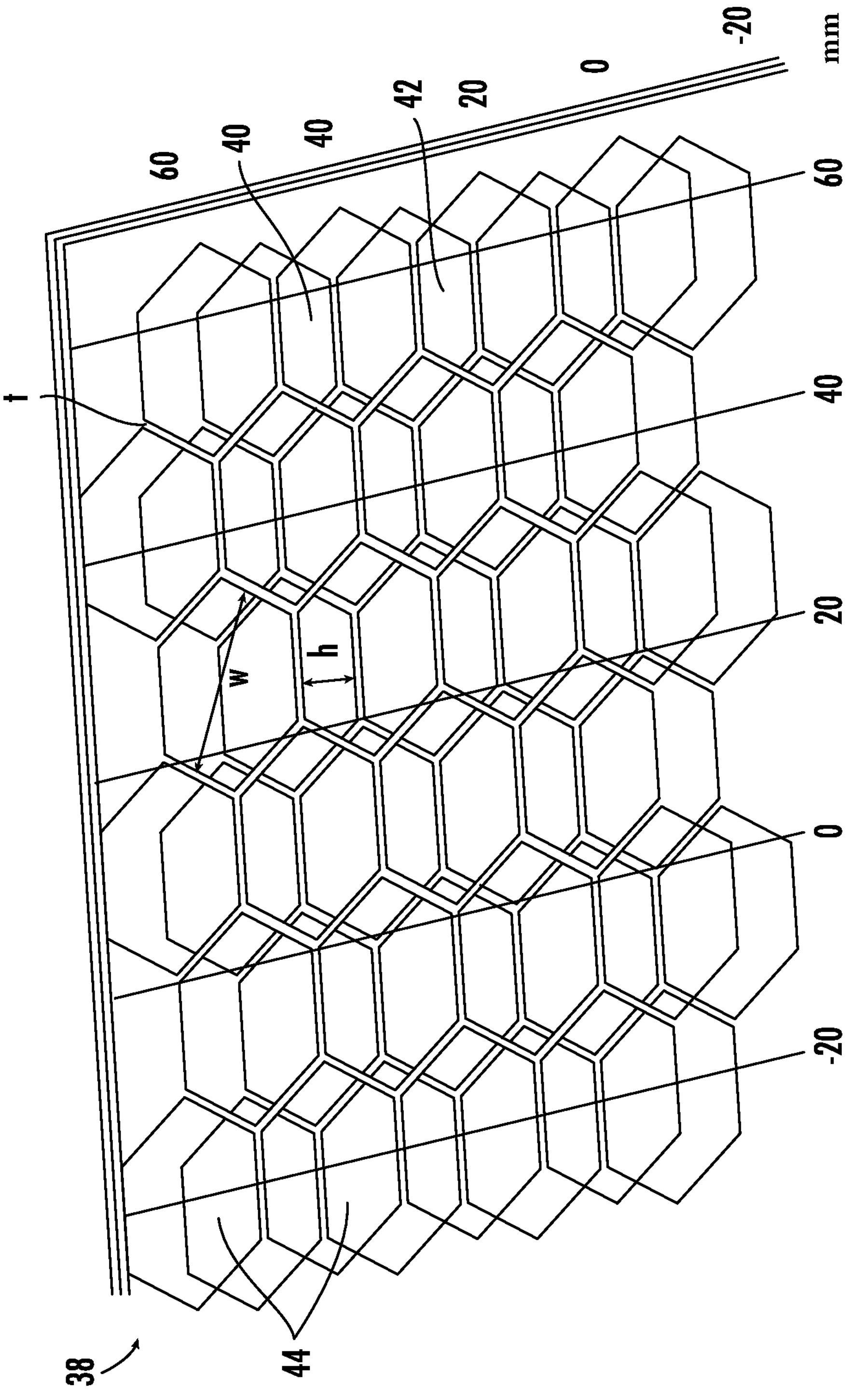
FIG. 3 is a schematic view of a grid of the invention with hexagonal shaped apertures.

FIG. 3 shows a grid 38 according to the present invention. In an embodiment of the invention, the grid 38 comprises an array of uniform cells 44 with substantially hexagonally shaped apertures 40. The grid is formed of a suitable thermally conductive material, such as titanium, stainless steel, copper, aluminium, or any combination thereof.

Known collimating filters are widely used in directional sputtering apparatus to improve the step coverage of small diameter, deep vias. Collimating filters are used to impart a high degree of directionality to the impinging species.

Wafer stress measurements were made using an industry standard instrument, TOHO Flexus-3300 Stress Gauge. The within wafer stress is a range value of stress, in which the stress is the intrinsic stress of the deposited film.

Figure 4B:
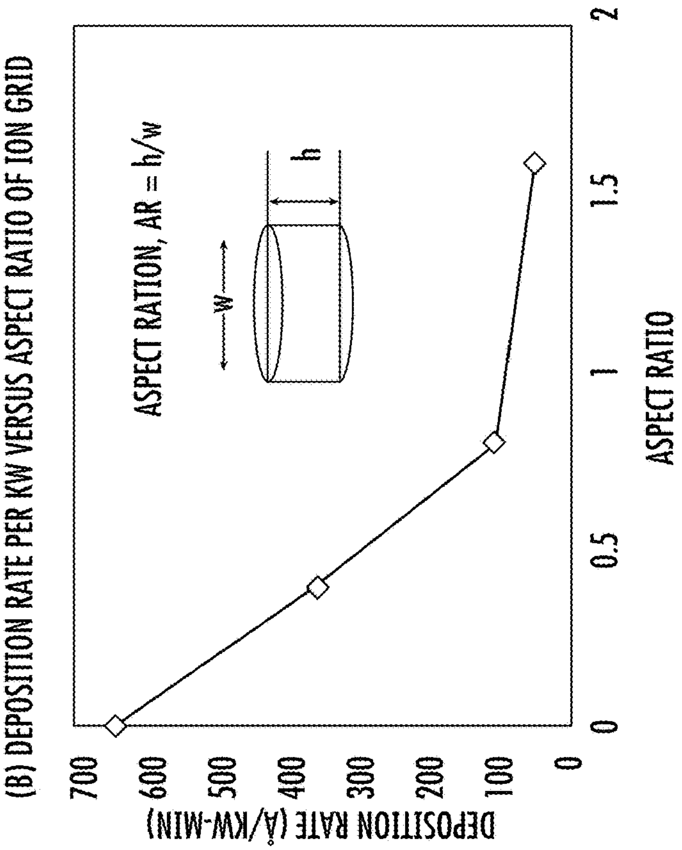
FIG. 4A shows within wafer stress range and FIG. 4B shows deposition rate as a function of grid aspect ratio.
Figure 4A:
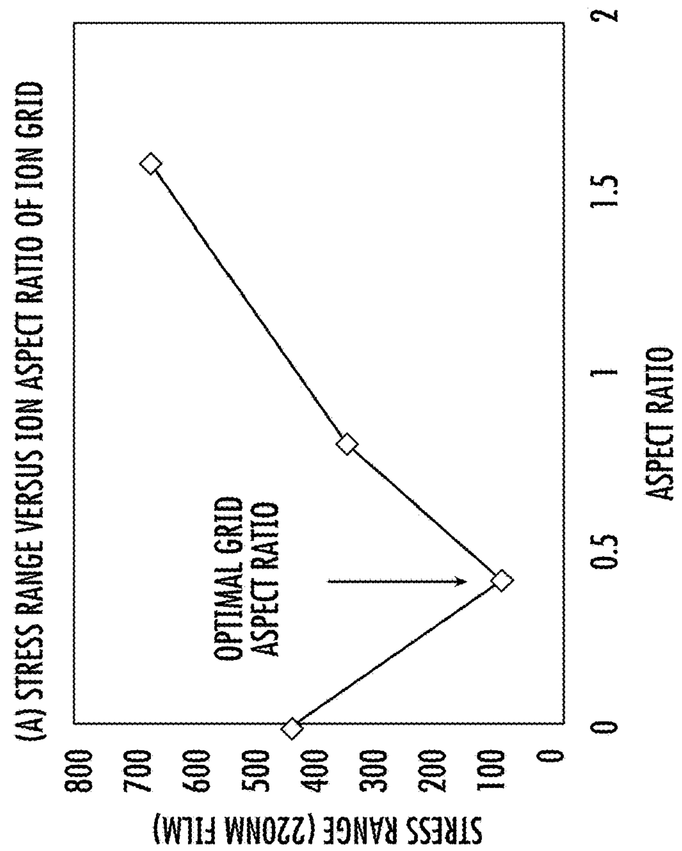

FIG. 4 shows how within wafer stress range and deposition rate are affected by the aspect ratio of the grid 38. FIG. 4A shows the within wafer stress range versus aspect ratio and FIG. 4B shows deposition rate versus aspect ratio for a typical Mo film. In this embodiment, the apertures of the grid have a substantially hexagonal shape, and the upper surface of the grid is positioned at approximately 18 mm from the lower surface of the target. The upper surface of the substrate support is positioned at a distance of around 50 mm from the lower surface of the target.

It can be seen that for a grid with a high aspect ratio and greater than 1:1, the stress range is very high and the deposition rate collapses. By increasing the aspect ratio, the directionality of the incoming species is increased. However, this regime does not help to solve the stress uniformity issue. In fact, it tends to exaggerate the effect of the source and increase the stress range.

As the aspect ratio of the grid 38 is reduced to less than 1:1, it has been found that the deposition rate begins to improve and, surprisingly, the within wafer stress range of the film is dramatically reduced. Without wishing to be bound by theory, it is believed that these effects are due to the removal of high energy species from the plasma onto the grid. In essence, it is believed that the low aspect ratio grid used in the apparatus of the present invention provides some thermalizing or spreading effect on the plasma, without imparting a high degree of directionality to the deposition species. By judicious optimisation of the grid aspect ratio, it is possible to minimise the impact of the major erosion zone 32 on the wafer stress and achieve excellent within wafer stress ranges with minimal impact on other film properties, such as thickness uniformity and density. The combination of a low aspect ratio grid and a short throw apparatus provides much higher deposition rates than are commonly achieved with a typical collimated sputtering apparatus. In particular, the deposition rate using the apparatus according to the present invention is reduced only by 50% compared to that for the conventional apparatus without a grid.

Figure 5A:
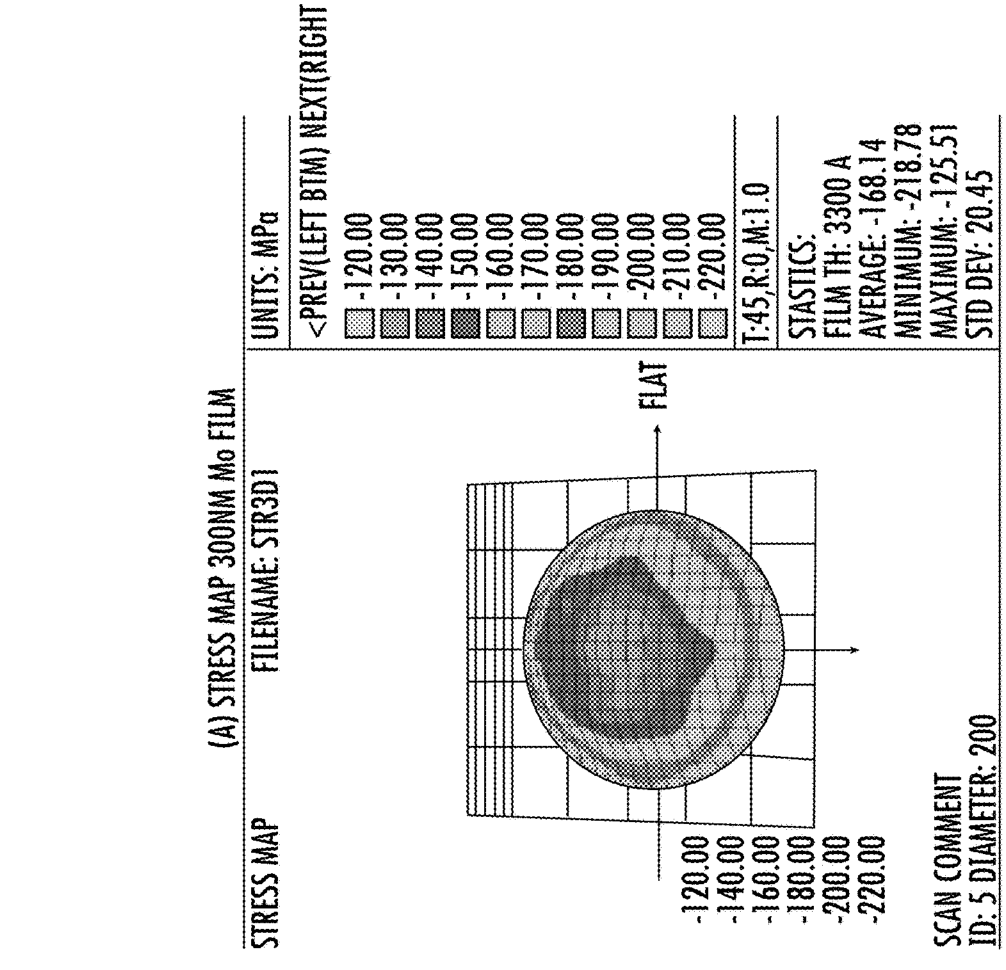
FIG. 5A shows a 3D stress map and FIG. 5B shows a single line scan of film stress across as a function of wafer diameter.
Figure 5B:
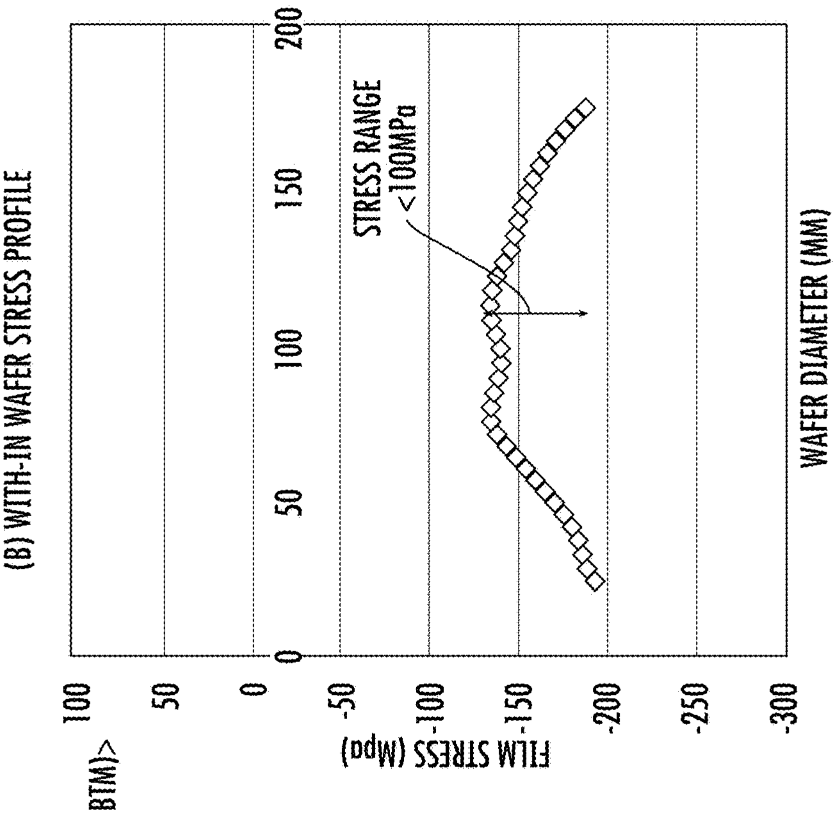

FIG. 5 shows a stress map and a cross wafer stress profile for a typical Mo electrode film deposited using the optimised grid geometry. FIG. 5A shows a 3D stress map and FIG. 5B shows a single line scan showing the stress across the wafer diameter for a 300 nm Mo film deposited at 6 kW, 200° C. and 50 sccm Ar on a 200 mm wafer. These results show a reduction of within wafer stress range from about 400 MPa when using the conventional hardware without a grid, to less than about 100 MPa when using the apparatus of the present invention. Excellent results have also been demonstrated on a 250 nm Ti film as shown in Table 1. These results show that the improvement in within wafer stress uniformity appears to be generally independent of the deposited material, film thickness or deposition properties, such as deposition power, pressure or absolute film stress.

TABLE 1

| Deposition Power (kW) | Stress Mean (MPa) | WIW Stress Range (MPa) |
|---|---|---|
| 2 | 51.32 | 113 |
| 4 | −131.9 | 175 |
| 6 | −168 | 79 |

Figure 6A:
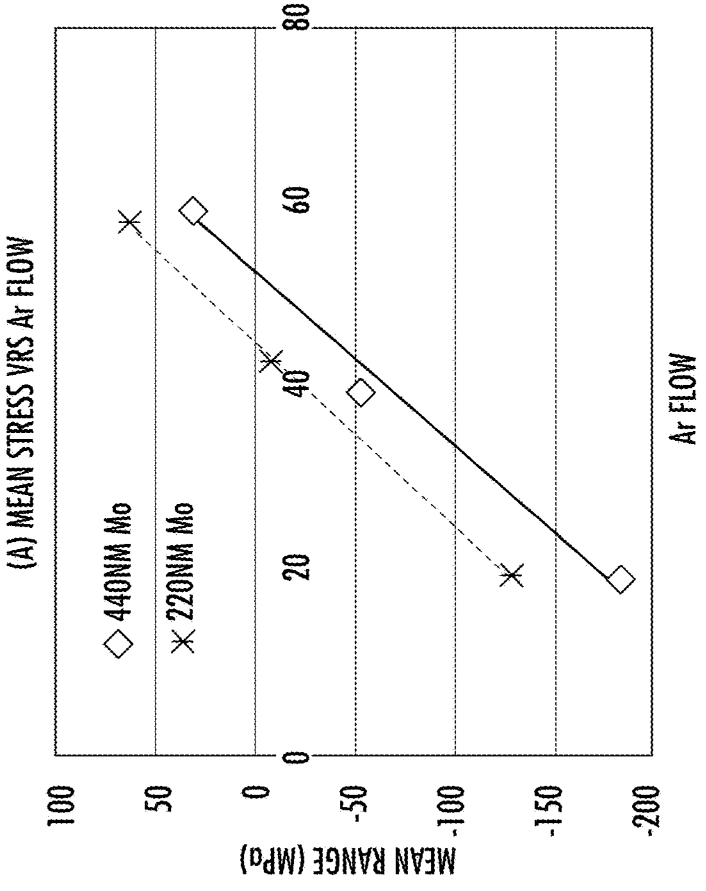
FIG. 6A shows mean stress and FIG. 6B shows within wafer stress range as a function of argon flow.
Figure 6B:
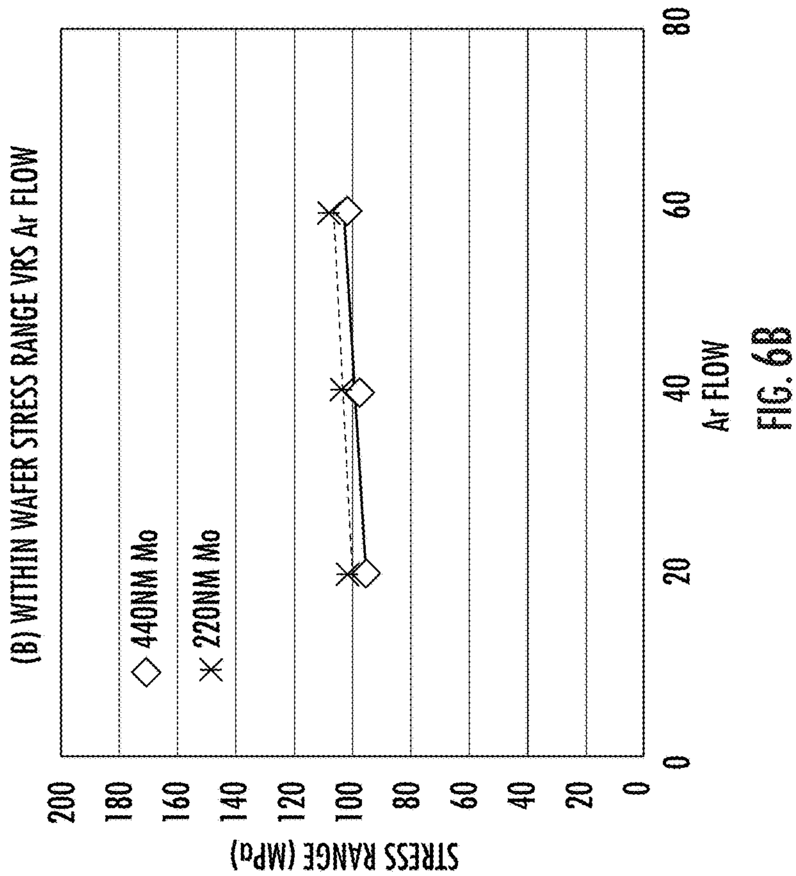

FIG. 6 shows that the average stress for a Mo film can be adjusted by changing the gas flow without impacting on the stress range of the films. FIG. 6A shows mean stress versus Ar flow and FIG. 6B shows within wafer stress range versus Ar Flow for a 220 nm and 440 nm Mo film deposited at 6 kW, 200° C. on a 200 mm Si wafer.

Without wishing to be bound by theory, it is believed that the increased deposition pressure as a result of the increased Ar flow leads to an overall increase in flux of reflected neutral Ar ions. These neutral Ar ions with an increased flux are incorporated into the growing metal film, resulting in an increase in average tensile stress of the film. Therefore, increased Ar flow leads to an increase in average tensile stress of the film. In the apparatus of the present invention, the target-to-wafer distance is typically much less than the mean free path of the sputtered atoms, so small variations in the gas flow do not make much difference to the atom trajectories. By judicious selection of the grid geometry of the present invention, a low within wafer stress range is advantageously maintained in the deposited film, even as the gas flow is changed. Therefore, the average tensile stress of the deposited film can advantageously be tuned by varying the gas flow, while the within wafer stress range is maintained at a relatively constant low level.

Figure 7B:
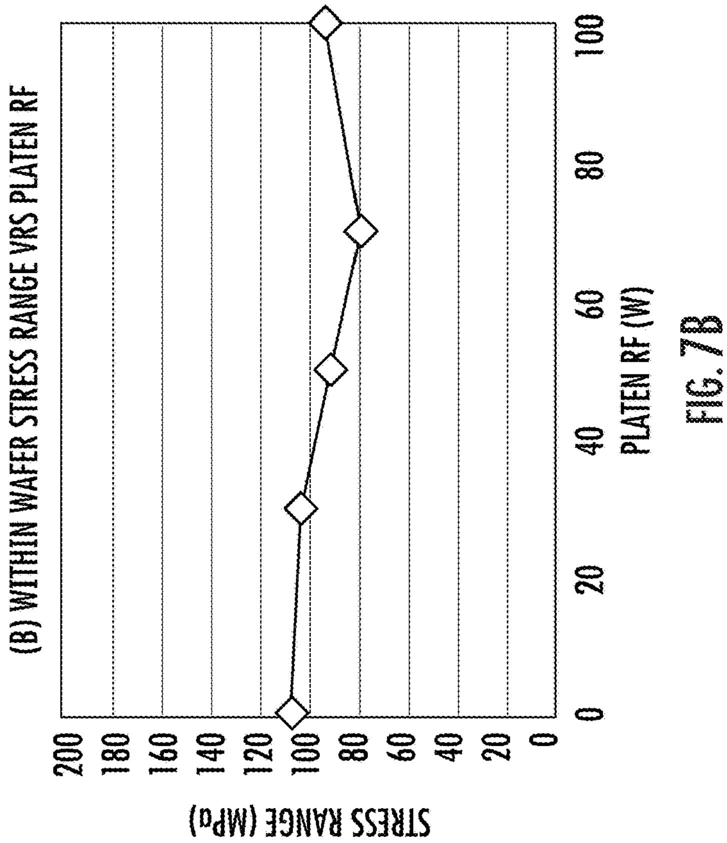
FIG. 7A shows mean stress and FIG. 7B shows within wafer stress range as a function of platen RF bias.
Figure 7A:
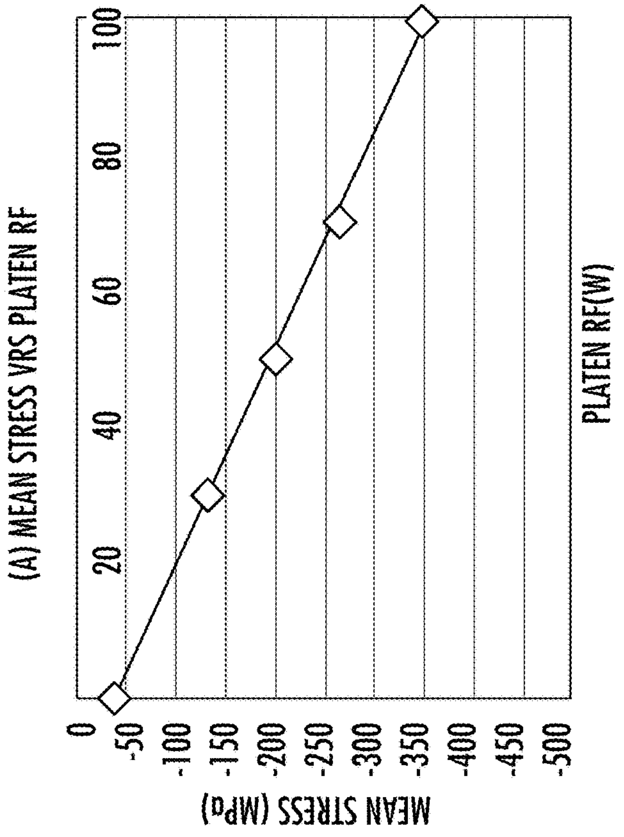

The grid 38 of the invention is compatible with an RF biased substrate support. By varying the RF bias to the substrate support, the absolute stress of the films can advantageously be tuned. FIG. 7A shows mean stress versus platen RF bias and FIG. 7B shows within wafer stress range versus platen RF bias for a 220 nm Mo film deposited at 6 kW, 200° C., with 50 sccm Ar on a 200 mm Si wafer. FIG. 7 shows how film stress for a 220 nm Mo film varies linearly with the addition of platen RF power from −50 to −350 MPa, but importantly that the within wafer stress range remains relatively constant at about 100 MPa across the whole stress range. Without wishing to be bound by theory, it is believed that the amount of ion bombardment taking place can be controlled by the application of an accelerating RF bias to the substrate support, while the ion distribution generated at the target in response to the rotating magnetron is controlled by the aspect ratio of the grid which flattens out the flux as seen at the wafer. As a result, the absolute stress of the deposited film can advantageously be tuned by varying the RF bias to the substrate support, while the within wafer stress range is maintained at a relatively constant low level.

What is claimed is:

1. A magnetron sputtering apparatus for depositing material onto a substrate, comprising:

a chamber comprising a substrate support and a target, wherein the substrate support is RF biased;

a DC power supply;

a rotating magnetron disposed on the chamber on an opposite side of the target from the substrate support, wherein the target is connected to the DC power supply, and wherein the rotating magnetron has a non-uniform plasma profile thereby generating high energy species at a minor erosion zone at a center of the target and at a major erosion zone away from the center of the target, wherein the major erosion zone surrounds an edge of the substrate on the substrate support; and only one thermally conductive grid comprising a plurality of cells, in which each cell comprises an aperture, wherein the cells have a uniform shape, distribution, width, and height across the thermally conductive grid, wherein the thermally conductive grid is electrically conductive and grounded, wherein a ratio of the height of the cells to the width of the apertures is in the range from 0.2 to 0.6, wherein the width of the apertures is from 10 mm to 25 mm, and wherein the height of each cell is 6 mm or less, and wherein the thermally conductive grid filters the high energy species generated at the major erosion zone, and wherein the grid is disposed about half way between an upper surface of the substrate support and the target and substantially parallel to the target, and the upper surface of the substrate support is positioned at a distance of 55 mm or less from a lower surface of the target and an upper surface of the grid is positioned at a distance from 18 mm to 26.5 mm from the lower surface of the target.

2. The apparatus according to claim 1, wherein the upper surface of the substrate support is positioned at a distance in the range 40 to 55 mm from the lower surface of the target.

3. The apparatus according to claim 1, wherein a shape of each of the apertures is substantially hexagonal.

4. The apparatus according to claim 1, wherein the material is Mo, W, Ta, Ti, Pt, Cr, Ru or Al.

5. A method for depositing material onto a substrate by magnetron sputtering comprising:

providing the magnetron sputtering apparatus according to claim 1;

supporting the substrate on the substrate support;

providing a plasma so that the material is sputtered from the target onto the substrate; and wherein the sputtered material passes through the apertures of the grid before reaching the substrate.

6. A method according to claim 5, wherein a shape of each of the apertures is substantially hexagonal.

7. A method according to claim 5, wherein the grid is electrically conductive and grounded.

8. A method according to claim 5, wherein the material is Mo, W, Ta, Ti, Pt, Cr, Ru or Al.

9. A method according to claim 5, wherein the substrate support is RF biased.

10. A substrate comprising a layer of material thereon, in which the material is deposited by a method according to claim 5 and the deposited layer of material has a within wafer stress value of less than 180 MPa.

11. A device comprising the substrate according to claim 4.

12. Use of the apparatus according to claim 1 for depositing a material layer on a substrate, in which the deposited material has a within wafer stress value of less than 180 MPa.

* * * * *